United States Patent Office 3,669,658

Patented June 13, 1972

3,669,658
PHOTOSENSITIVE PRINTING PLATE

Teruhiko Yonezawa and Kesanao Kobayashi, Odawara-shi, and Teruo Kobayashi, Kanagawa, Japan, assignors to Fuji Photo Film Co., Ltd., Kanagawa, Japan No Drawing. Filed June 11, 1969, Ser. No. 832,493
Int. Cl. G03f *7/02;* G03o *1/52*
U.S. Cl. 96—33 3 Claims

ABSTRACT OF THE DISCLOSURE

A light-sensitive layer on a photosensitive printing plate which yields a visible image upon exposure to light comprising an o-quinone diazide or an o-naphthoquinone diazide, and a leuco dye.

BACKGROUND OF THE INVENTION

Field of the invention

This invention relates to a photosensitive printing plate, more particularly a photosensitive printing plate which is capable of forming a visible image upon exposure to light.

Description of the prior art

In general, photosensitive printing plates are classified into one of three types, namely, lithograph, intaglio or relief plates. A photosensitive lithographic plate is prepared by rendering the surface of a support hydrophilic by chemical or physical treatment or by application of a hydrophilic high molecular weight substance thereto and thereafter applying thereto a photosensitive substance, as set forth hereinafter.

The photosensitive substance for application to lithographic plates includes, for negative working, condensates of p-diazodiphenylamine with formaldehyde (as disclosed in German Pat. No. 596,731) and derivatives thereof, 3-nitroanthanilic acid (as disclosed in U.S. Pat. 2,729,562), diazo derivatives of aromatic or heterocyclic amines (as disclosed in German Pat. No. 949,383 and No. 955,928), reaction products of a diazosulfonate with a diazonium salt (as disclosed in U.S. Pat. 2,890,115) and p-quinone azides (as disclosed in British Pat. No. 859,781). For positive working, o-quinone diazide derivatives (as disclosed in Liebig Ann. Chem. 598, 123 (1956), reaction products of a ferrocyanide with p-diazodiphenylamine (as disclosed in U.S. Pat. 3,113,023), reaction products of a diazonium salt with a hetero- or iso-polyacid of a group V*a* or VI*a* element of the periodic table (as disclosed in U.S. Pat. 3,211,553), fluoroborates of a diazonium compound and an organosilicon compound (as disclosed in U.S. Pat. 2,804,388), combinations of a diazonium compound with a polymer coupler (as disclosed in U.S. Pat. 2,687,958) and the like are among the various photosensitive substances useful.

The photosensitive substance useful for relief plate fabrication includes reaction products of polyvinyl alcohol or polystyrene with cinnamoyl chloride (as disclosed in U.S. Pat. 2,566,302), Calcon-type polymers prepared by combining a hydroxyl group-containing Calcon with, e.g., a maleic anhydride copolymer, 2-aryl-N-vinylpyridiniumarylsulfonates (as disclosed in J. Appl. Polym. Sci. 7,273), and the like. The photosensitive relief plate is prepared by applying such a photosensitive substance to a metal plate. In addition, nylon reliefs, cellulose plastic reliefs and the like can be formed.

Inconveniently, such photosensitive printing plates do not form any visible image thereon in the exposed state, and require a developing treatment for the formation of a visible image. Especially, in the case of a lithographic plate, it is difficult to put the plate exactly in position for a double or multiple exposure. Further, during removal of the unnecessary lipophilic areas, it is difficult to completely remove the unnecessary areas without the simultaneous removal of necessary areas. This is because it is impossible to distinguish the necessary areas from the unnecessary areas.

SUMMARY OF THE INVENTION

The present invention provides a novel photosensitive printing plate wherein a light-sensitive layer is utilized which yields a visible image upon exposure. The light-sensitive layer, applied on a support, comprises an o-quinone diazide or an o-naphthoquinone diazide, in combination with a leuco dye.

One object of the present invention is to provide a photosensitive printing plate which immediately forms a visible image upon exposure to light.

DESCRIPTION OF THE PREFERRED EMBODIMENTS

We have hitherto discovered a photosensitive material comprising a halogen-containing high molecular compound and a leuco dye which is capable of forming a visible image when exposed to light. This is described in Japanese patent publication No. 18,644/61. As a result of further investigations, we have arrived at the present invention.

The object of the present invention is achieved by incorporating a leuco dye in a photosensitive printing plate having a layer containing an o-quinone diazide or an o-naphthoquinone diazide as the photosensitive substance.

The o-quinone diazide or o-naphthoquinone diazide used as a photosensitive substance usually decomposes upon exposure to light into cyclopentadiene carboxylic acid or indene carboxylic acid, respectively, in accordance with the following reactions (1) or (2).

(1)

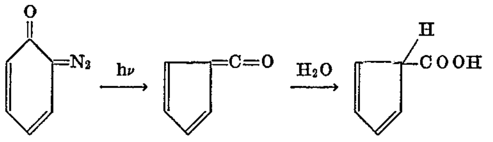

(2)

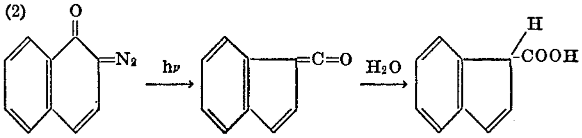

These acids react with a leuco dye, and a colored visible image will be formed in the exposed areas.

The leuco dyes useful in this invention include 4,4'-tetramethyldiaminodiphenylmethane, Michler's hydrol, Michler's hydrol methyl ether, bis(4,4'-bis-dimethylaminobenzhydryl) ether, 4,4' - tetramethyldiaminodiphenylmethyl benzoate, tetramethylbenzidine, Crystal Violet lactone, Crystal Violet carbinol base, Crystal Violet carbinol ethyl ether, Malachite Green carbinol base, Malachite Green lactone, Malachite Green carbinol methyl ether, Malachite Green carbinol ethyl ether, Primocyanine carbinol base, Primocyanine carbinol methyl ether, Rhodamine B anilinolactam, Primocyanine carbinol ethyl ether, Spirit Skyblue carbinol base, Spirit Skyblue carbinol methyl ether, Spirit Skyblue carbinol ethyl ether N-phenyl leuco Auramine, N-(P-chlorophenyl) leuco Auramine, and the like.

The o-quinone diazides or o-naphthoquinone diazides used in the present invention are known in the art. These are, for example, described in U.S. Pat. 2,772,972; British Pat. 889,363; U.S. Pat. 2,767,092; U.S. Pat. 2,766,118; U.S. Pat. 2,859,112; U.S. Pat. 2,907,655; U.S. Pats.

3,046,110–3,046,116; U.S. Pats. 3,046,118–3,046,119; U.S. Pats. 3,046,121–3,046,124; U.S. Pat. 3,061,430; U.S. Pat. 3,102,809; and U.S. Pat. 3,106,465.

Into the photosensitive printing plate of the present invention there may be added a phenolic resin, dye, pigment, surface active agent, plasticizer and other materials, in addition to an o-quinone diazide or o-naphthoquinone diazide as the photosensitive substance and a leuco dye. No criticality is attached to these "extra" additives.

These substances are dissolved in a solvent, such as dioxane, dimethylformamide, ethyleneglycol esters, cyclohexanone, methyl ethyl ketone, etc., and applied to a support such as a paper, a plastic sheet, glass, a metal plate, etc., and dried. When the resulting photosensitive printing plate is exposed through a transparent positive or negative to light, exposed areas of the plate develop color. As a light source there may be used a xenon lamp carbon arc lamp, fluorescent lamp, tungsten lamp, etc. The mixing ratio of the o-quinone diazide or the o-naphthoquinone diazide to the leuco dye can be easily determined by one skilled in the art. The most preferable range is from 1:0.03 to 1:1, by weight.

Although a very small amount of water is required for color formation, as illustrated in Equation 1 or 2, moisture absorbed from air is generally sufficient to fill this need.

Since the photosensitive printing plate of the present invention yields a color image to form a visible image upon exposure to light, it is easy to put the plate exactly into position in a double (or multiple) exposure or printing. Needless to say, the ordinary pre-sensitized plate is very inconvenient for double or multiple printing because it does not form any visible image thereon when exposed through a positive or negative to light, despite any photochemical changes, because in this case, the preceding printed area is obscured. On the contrary, if there is formed a visible image on the plate by the preceding printing, as in the case of the present invention, the decision of the exact position of the plate is very easy to determine.

The present invention will now be illustrated in more detail by the following examples.

Example 1.—A solution containing following ingredients was prepared.

| | G. |
|---|---|
| o-Naphthoquinone diazide of the formula [1] | 2 |
| Phenolic resin (Hitachi Kasei Co., Ltd.) | 2 |
| Rhodamine B anilinolactam | 0.2 |
| Methyl ethyl ketone | 30 |
| Cyclohexanone | 20 |

[1] Formula:

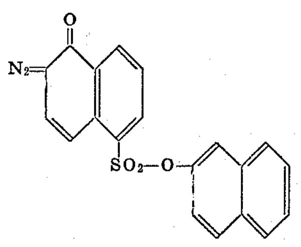

The solution was applied to an aluminum plate which was treated with an aqueous solution of zirconium hexahalide (as disclosed in U.S. Pat. 2,946,683) and dried.

Onto the surface of the photosensitive printing plate a transparent positive film was superposed, and the plate was exposed to a carbon arc lamp of 30 A. positioned about 70 cm. from the plate. Upon exposure for about three minutes, magenta color developed in the exposed areas to form a reversal image of the original on the plate.

The visible image was more distinct under subdued yellows light because the yellow color of the unexposed areas is brought out by the subdued light to give an intensified contrast, so that the register mark was detectable without any difficulty or double printing.

The development of the printing plate thus formed was carried out in a conventional manner, namely, by soaking the plate in a 5% aqueous solution of trisodium phosphate, whereby, during "leaching" for two minutes the magenta-colored image areas were dissolved out to give a printing plate.

Example 2.—To an aluminum plate degreased in a conventional manner, there was applied a coating solution of the following composition to form a printing plate.

| | G. |
|---|---|
| o-Naphthoquinone diazide of the formula [1] | 2 |
| Phenolic resin AP–120 (Gunei Kagaku Co., Ltd.) | 1 |
| Bis(4,4'-bis-dimethylaminobenzhydryl) ether | 0.2 |
| Pink OP (Orient Kagaku Co., Ltd.) | 0.1 |
| Methyl isobutyl ketone | 25 |
| Cyclohexane | 5 |

[1] Formula:

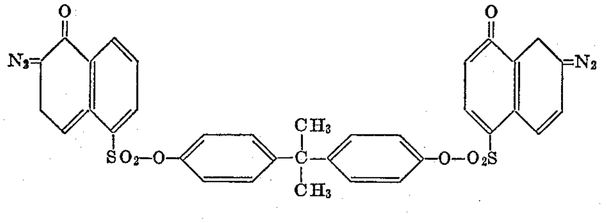

The sensitized plate thus formed was superposed with a transparent positive film and exposed for two minutes to a carbon arc lamp of 30 A. positioned 70 cm. therefrom. The exposed areas discolored to violet, forming a striking contrast with the red of the unexposed areas. The exposed plate was developed in the usual manner, for instance, the plate was soaked in a 3% aqueous trisodium phosphate solution while rocking it, whereupon the exposed areas were dissolved giving a remaining red colored image.

Thus, by combination of a dye and a leuco dye it is made possible to produce pre-sensitized plates of which image is easily confirmable in any stage from exposure to printing.

Example 3.—3 g. of an ester of naphthoquinone-(1,2)-diazide-(2)-5-sulfonic acid (described in British Patent 1,113,759) and 0.5 g. of Crystal Violet lactone were dissolved in 30 g. of methyl ethyl ketone and the resulting solution was applied to Planomaster ID (an offset printing master, produced by Fuji Photo Film Co., Ltd.) and dried. The master thus presensitized was developed to a blue color by irradiation with ultraviolet rays. Accordingly, since the plate thus prepared had a visible image after exposure, an exposed and unexposed plate were easily distinguished, while, in case of the prior art plates, it was difficult to distinguish exposed from unexposed plates, especially under a yellow subdued light, so that a worker often commits the error of exposing an already exposed plate.

To further expand upon the above invention, it will be obvious to one skilled in the art that in addition to o-quinone diazides and o-naphthoquinone diazides, mixtures thereof could be utilized in combination with a leuco dye. Further, it will be seen from a review of the o-quinone diazides and/or the o-naphthoquinone diazides described in the art cited in the specification, that the present invention is to have wide applicability with respect to the specific diazides and the specific leuco dyes utilized therein. A review of the material set out provides an appreciation of the scope of the present invention.

We claim:

1. A photosensitive printing plate comprising a support and a light-sensitive layer which comprises a light-sensitive compound selected from the group consisting of an o-quinone diazide, an o-naphthoquinone diazide, and mixtures thereof, and a leuco dye.

2. A photosensitive printing plate according to claim 1 wherein the leuco dye is a member selected from the group consisting of 4,4′ - tetramethyldiaminodiphenylmethane, Michler's hydrol, Michler's hydrol methyl ether, bis(4,4′ - bis-dimethylaminobenzhydryl) ether, 4,4′-tetramethyldiaminodiphenylmethyl benzoate, tetramethylbenzidine, Crystal Violet lactone, Crystal Violet carbinol base, Crystal Violet carbinol ethyl ether, Malachite Green carbinol base, Malachite Green lactone, Malachite Green carbinol methyl ether, Malachite Green carbinol ethyl ether, Primocyanine carbinol base, Primocyanine carbinol methyl ether, Rhodamine B anilinolactam, Primocyanine carbinol ethyl ether, Spirit Skyblue carbinol base, Spirit Skyblue carbinol methyl ether, Spirit Skyblue carbinol ethyl ether N-phenyl leuco Auramine and N-(P-chlorophenyl) leuco Auramine.

3. The photosensitive printing plate of claim 1 wherein the weight ratio of said diazide to said leuco dye is within the range 1:0.03–1:1.

References Cited

UNITED STATES PATENTS

| | | | |
|---|---|---|---|
| 3,029,146 | 4/1962 | Schmidt et al. | 96—49 |
| 3,201,239 | 8/1965 | Neugebauer et al. | 96—33 X |

NORMAN G. TORCHIN, Primary Examiner

A. T. SURO PICO, Assistant Examiner

U.S. Cl. X.R.

96—91 D, 49